United States Patent [19]

Tamaki et al.

[11] Patent Number: 5,784,285
[45] Date of Patent: Jul. 21, 1998

[54] WAVEFORM ANALYZER

[75] Inventors: Naoya Tamaki; Norio Masuda; Hirokazu Tohya, all of Tokyo, Japan

[73] Assignee: NEC Corporation, Tokyo, Japan

[21] Appl. No.: 792,732

[22] Filed: Jan. 31, 1997

[30] Foreign Application Priority Data

Jan. 31, 1996 [JP] Japan .................................. 8-015107

[51] Int. Cl.$^6$ ........................................ G06J 1/02
[52] U.S. Cl. ........................ 364/487; 324/76.12
[58] Field of Search ........................ 364/487, 572; 324/76.12, 76.19, 76.29; 367/38, 43, 56, 60

[56] References Cited

U.S. PATENT DOCUMENTS 5,262,958 11/1993 Chui et al. .................. 364/487

OTHER PUBLICATIONS

Bertrand et al., "Time–Frequency Digital Filtering Based on an Invertible Wavelet Transform: An Application to Evoked Potentials", IEEE Transactions on Biomedical Engingeering, vol. 41, No. 1, Jan. 1994, pp. 77–88.

Primary Examiner—Emanuel Todd Voeltz
Assistant Examiner—Thomas Peeso
Attorney, Agent, or Firm—Foley & Lardner

[57] ABSTRACT

Disclosed is a waveform analyzer, which inputs measured data of an electronic device to be analyzed; generates an orthogonal analyzing wavelet; produces wavelet-analyzed components in which the measured data is wavelet-transformed into a plurality of wavelet spectra by using the orthogonal analyzing wavelet, thereafter the plurality of wavelet spectra are inverse-wavelet-transformed to produce the wavelet-analyzed components; and adds up a component with an order corresponding to a desired filter characteristic of the wavelet-analyzed components to get a filtered waveform.

6 Claims, 9 Drawing Sheets

FIG. 1 PRIOR ART

FIG. 2A PRIOR ART
fp = 40kHz

FIG. 2D PRIOR ART
fp = 20kHz

FIG. 2B PRIOR ART
fp = 30kHz

FIG. 2E PRIOR ART
fp = 15kHz

FIG. 2C PRIOR ART
fp = 25kHz

FIG. 2F PRIOR ART
fp = 10kHz

(FIRST)

FIG.6B

(SECOND)

FIG.6C

(THIRD)

FIG.6D (FOURTH)

FIG.6E

(FIFTH)

FIG.6F

(SIXTH)

FIG.6G (SEVENTH)

FIG.6H (EIGHTH)

WAVEFORM ANALYZER

FIELD OF THE INVENTION

This invention relates to a waveform analyzer, and more particularly to, a waveform analyzer which analyzes an electromagnetic wave radiated from an electronic device or a voltage and current of an electronic device and outputs noise analysis information such as a line noise.

BACKGROUND OF THE INVENTION

In electronic devices which use an electric energy, a large employment of a semiconductor device causes harmonic interferences to an electric power system supplying an electric energy and to peripheral devices. Because of this, all electronic devices, regardless of including a semiconductor device, are obliged to adopt a way of relaxing effects to the electric power system and peripheral devices.

The first step for relaxing such electromagnetic field effects due to the electronic device is an analysis of electromagnetic field temporal and spacial distribution waveforms radiated from the electronic device. A conventional technique for electromagnetic field waveform analysis is the Fourier analysis. The Fourier analysis is the most effective method for determining a harmonic component content of a waveform, therefore it has been a standard analysis method in the measures for environmental electromagnetic field.

Generally used for the waveform analysis is a spectrum analyzer. The spectrum analyzer is a Fourier transformer, which is used, for example, to determine which frequency component noise is reduced due to the adoption of a filter for reducing a line noise, or to determine a frequency intensity of electromagnetic noise radiated from a electronic device. The advantage of the Fourier analysis is that a distortion of waveform can be quantitatively estimated by a harmonic component content since a waveform is decomposed into harmonic components.

Figure 1:
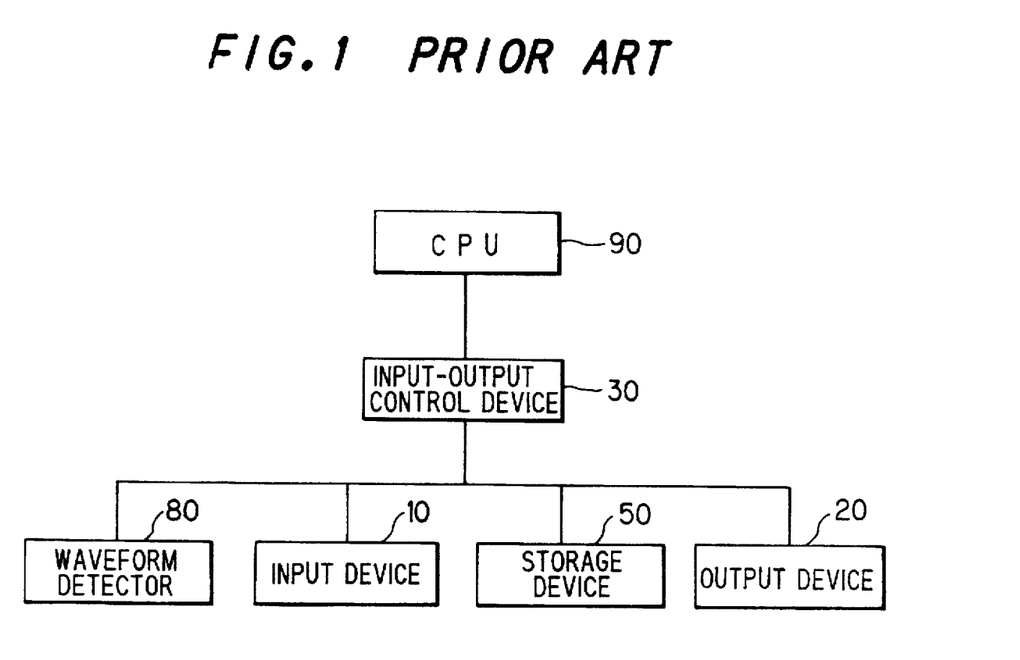
FIG. 1 is a block diagram showing a conventional waveform analyzer.
Figure 2A:
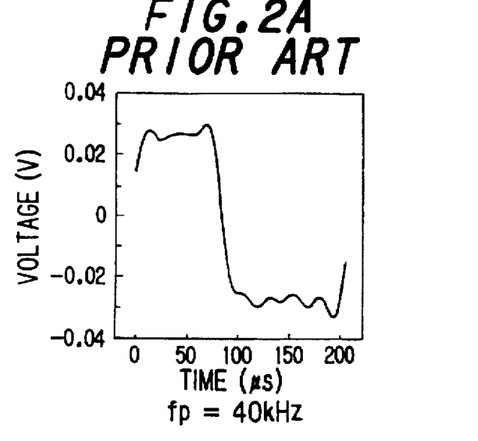
FIGS. 2A to 2F show waveforms for explaining the filtering process in a conventional waveform analyzer.
Figure 2B:
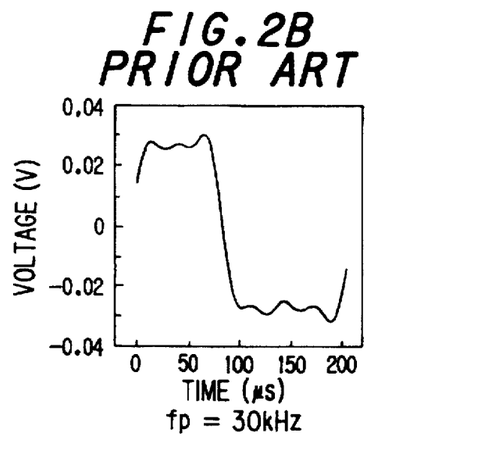
Figure 2C:
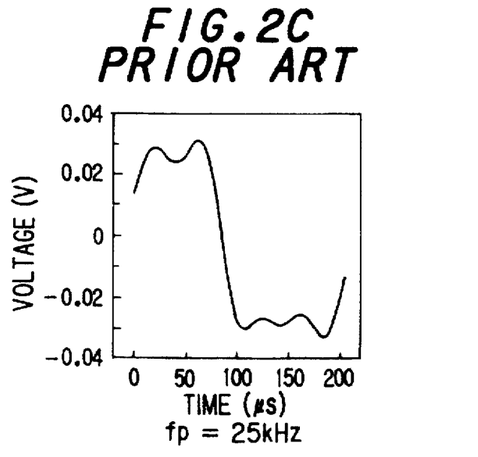
Figure 2D:
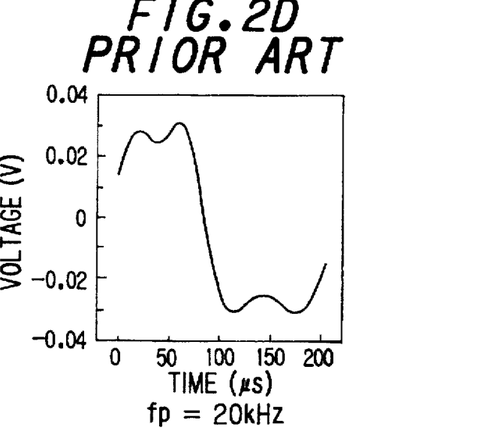
Figure 2E:
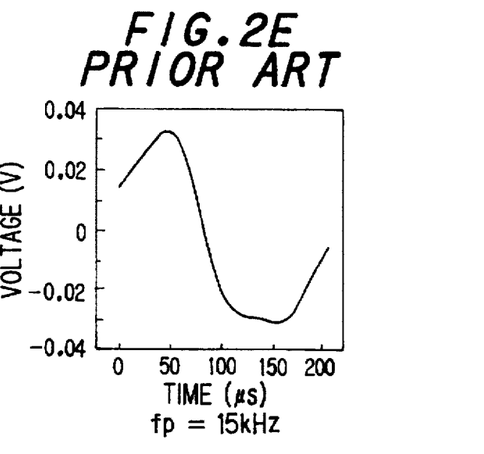
Figure 2F:
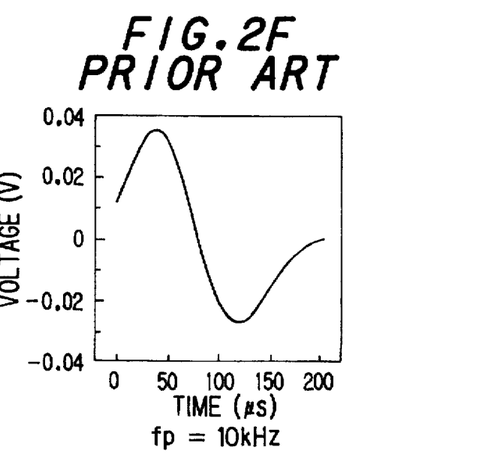

FIG. 1 is a block diagram showing a conventional waveform analyzer. As shown in FIG. 1, the waveform analyzer comprises an input device 10, an output device 20, an input-output control device 30, a storage device 50, a waveform detector 80 and CPU 90 which has functions of filtering, Fourier analysis and the like.

In operation, a waveform to be analyzed, which is detected by the waveform detector 80, is supplied through the input-output control device 30 to CPU 90, where a waveform analysis is conducted by using the filtering and Fourier analysis, then the result of the waveform analysis is stored in the storage device 50 and is output through the output device 20 as an analysis result of the spectrum analyzer.

In the conventional waveform analyzer, an original data (measured data) is converted into a frequency domain, and the frequency and the corresponding frequency information composed of amplitude and phase information are waveform-analyzed only by the Fourier analysis, i.e., all things are discussed by converting into the frequency domain. Therefore, it has a demerit that information as to time domain and spacial position is lost. For example, in a waveform including a pulse-like noise, the Fourier spectrum is broadened, therefore it becomes difficult to catch the characteristics in time domain that are included in the original data. Herein, to remove a noise to extract an essential waveform corresponding to a phenomenon occurred, the filtering process has to be conducted in frequency domain or time domain. However, since components

2 after the Fourier analysis is of a continuous function, the setting of the filtering process parameter, which determines which frequency corresponding component is removed or reduced, depends on operator's experience.

FIGS. 2A to 2F show waveforms in the filtering process. As shown in FIGS. 2A to 2F, it can be appreciated that the waveform after the filtering becomes smooth as the cut-off frequency(fp) becomes low since the higher frequency component is suppressed. However, one cannot judge which waveform is related with the circuit operation and should be extracted.

To compensate for such demerit of the Fourier analysis, suggested are a Fourier transform which is partially conducted in a section where a pulse exists, i.e., a Fourier transform with a window function, and a short-time Fourier transform etc. These techniques can provide some information as to time domain, whereby the setting of the filtering process parameter can be suggested. However, in these modified Fourier transform techniques, if the time information is increased, the frequency precision will be lost, or, if frequency precision is enhanced, the time information will be lost. Thus, they must have so-called 'uncertainty'.

Though the above explanation is related to the time waveform, it is as well applicable to data in the space domain when determining the distribution of electromagnetic noise.

SUMMARY OF THE INVENTION

Accordingly, it is an object of the invention to provide a waveform analyzer in which an essential waveform component related with a circuit operation can be extracted from a measured waveform.

It is a further object of the invention to provide a waveform analyzer in which a waveform analysis with little uncertainty can be performed.

According to the invention, a waveform analyzer, comprises:

means for inputting measured data of an electronic device to be analyzed;

means for generating an orthogonal analyzing wavelet;

means for producing wavelet-analyzed components in which the measured data is wavelet-transformed into a plurality of wavelet spectra by using the orthogonal analyzing wavelet, thereafter the plurality of wavelet spectra are inverse-wavelet-transformed to produce the wavelet-analyzed components; and means for adding up a component with an order corresponding to a desired filter characteristic of the wavelet-analyzed components to get a filtered waveform.

According to another aspect of the invention, a waveform analyzer, comprises:

means for inputting measured data of an electronic device to be analyzed;

means for generating an orthogonal analyzing wavelet;

means for producing wavelet-analyzed components in which the measured data is wavelet-transformed into a plurality of wavelet spectra by using the orthogonal analyzing wavelet, thereafter the plurality of wavelet spectra are inverse-wavelet-transformed to produce the wavelet-analyzed components;

means for analyzing a correlation between each of the wavelet analyzed components and the measured data input by the inputting means; and means for adding up a component with a correlation analysis result bigger than a threshold value of the wavelet-analyzed components to get a waveform in which a component with a correlation analysis result smaller than the threshold value is removed.

According to a further aspect of the invention, a waveform analyzer, comprises:

means for inputting measured data of an electronic device to be analyzed;

means for generating an orthogonal analyzing wavelet and a window function;

means for producing wavelet-analyzed components by wavelet-analyzing a limited time section of the measured data by using the orthogonal analyzing wavelet and the window function; and means for adding up a component with an order corresponding to a desired filter characteristic of the wavelet-analyzed components to get a filtered waveform.

According to a further aspect of the invention, a waveform analyzer, comprises:

means for inputting measured data of an electronic device to be analyzed;

means for generating an orthogonal analyzing wavelet and a window function;

means for producing wavelet-analyzed components by wavelet-analyzing a limited time section of the measured data by using the orthogonal analyzing wavelet and the window function;

means for analyzing a correlation between each of the wavelet analyzed components and the measured data input by the inputting means; and means for adding up a component with a correlation analysis result bigger than a threshold value of the wavelet-analyzed components to get a waveform in which a component with a correlation analysis result smaller than the threshold value is removed.

BRIEF DESCRIPTION OF THE DRAWINGS

The invention will be explained in more detail in conjunction with the appended drawings, wherein.

DESCRIPTION OF THE PREFERRED EMBODIMENTS

Figure 3:
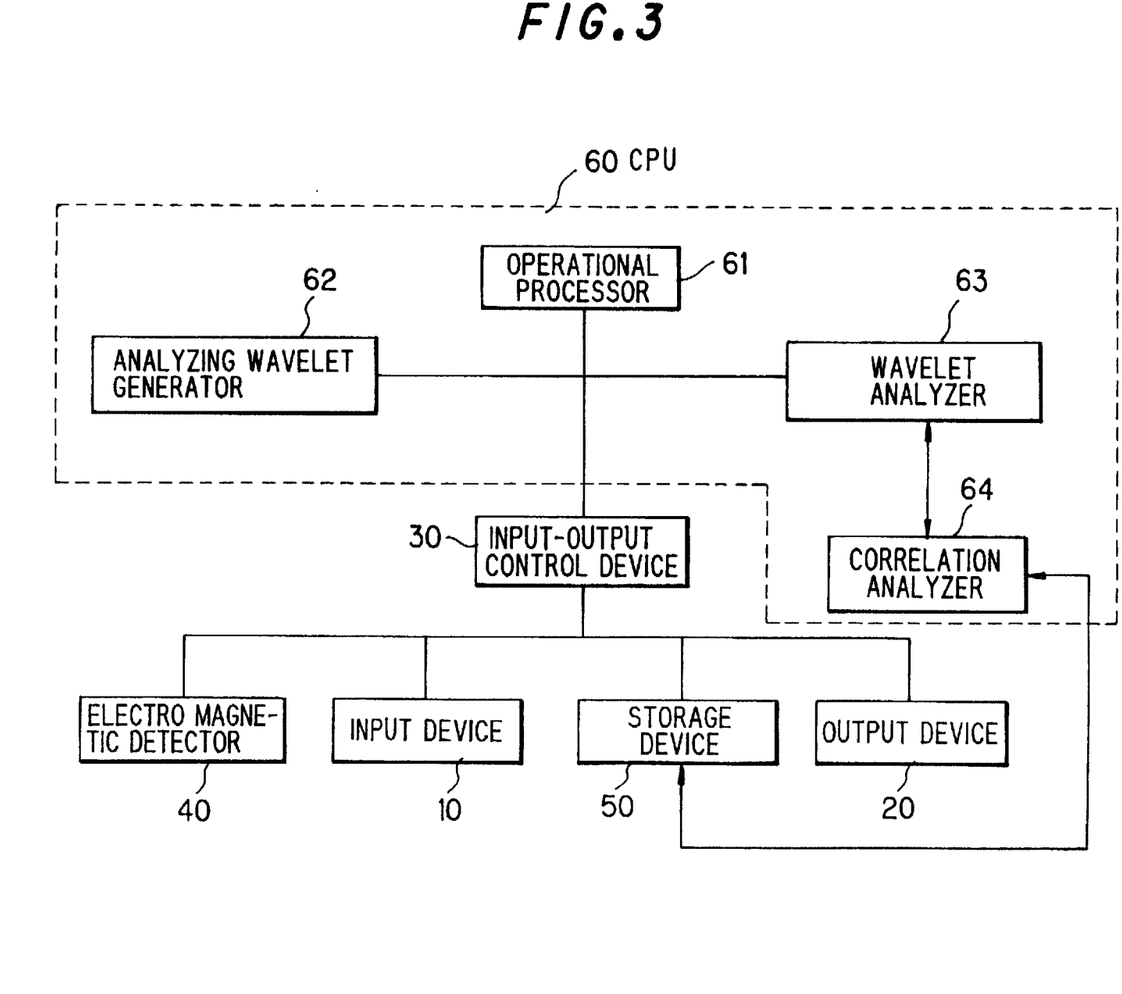
FIG. 3 is a block diagram showing a waveform analyzer in a preferred embodiment according to the invention.

A waveform analyzer in the preferred embodiment will be explained in FIG. 3, wherein like parts are indicated by like reference numerals as used in FIG. 1. As shown in FIG. 3, the waveform analyzer comprises an input device 10, an output device 20, an input-output control device 30, an electromagnetic detector 40, a storage device 50 and CPU 60. CPU 60 has functions of wavelet analysis, correlation analysis etc., which comprises an operational processor 61, an analyzing wavelet generator 62, a wavelet analyzer 63 and a correlation analyzer 64.

In this embodiment, the wavelet analysis is employed as a method of analyzing measured data. Though the Fourier analysis is used to get the frequency information, when the wavelet analysis is employed, measured data can be analyzed on both time domain and frequency domain or on both space frequency and space position domain.

Figure 4:
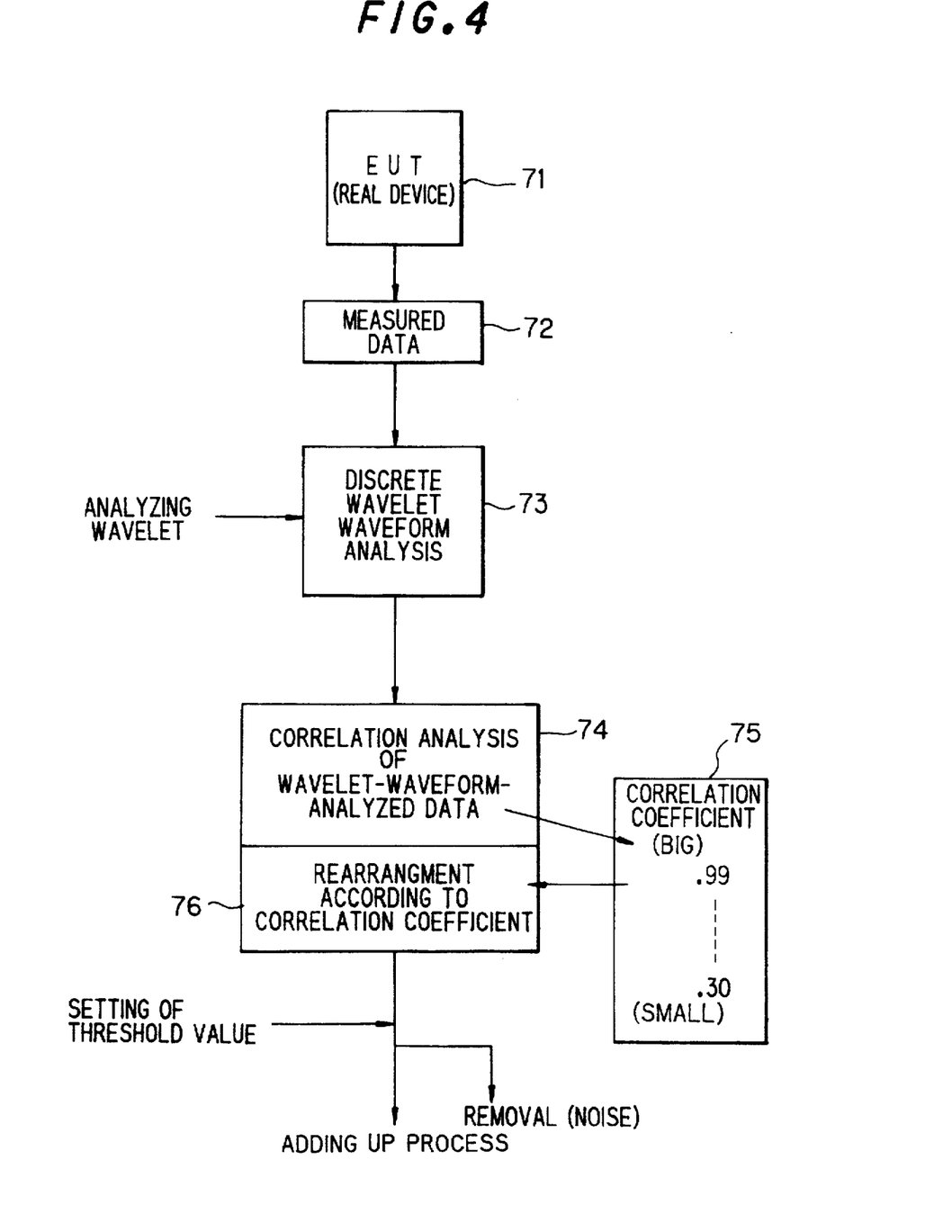
FIG. 4 is a flow chart for explaining the operation of the waveform analyzer in FIG. 3.

FIG. 4 is a flow chart for explaining an operation in the waveform analyzer in FIG. 3, where a measured data is analyzed on both frequency domain and time domain. First, a measured data is collected by the electromagnetic detector 40 from EUT(a device to be measured) 71 (Step 72). The measured data is input through the input-output control device 30 to the wavelet analyzer 63 in CPU 60 and stored in the storage device 50. Meanwhile, the measured data may be input through the input device as it is or after it is processed.

On the other hand, a Daubechies's analyzing wavelet, which is produced as an orthogonal analyzing wavelet by the analyzing wavelet generator 62 in CPU 60, is input to the wavelet analyzer 63, where the discrete wavelet waveform analysis of the measured data is conducted(Step 73). The Daubechies's analyzing wavelet is one of orthogonal wavelets of the discrete value system. It is known that coefficients of the analyzing wavelet(in case of having four coefficients) are given by:

$$C_3 - C_2 + C_1 - C_0 = 0 \tag{1}$$

$$0C_3 - 1C_2 + 2C_1 - 3C_0 = 0 \tag{2}$$

Equation (1) means that, if input data has constant values, the solution is always zero. Equation (2) means that, even when input data increases monotonously, the solution is always zero. Thus, when the input data has a slope of a quadratic or more function, the solution has a value other than zero, thereby being detectable. The wavelet analysis is researched as a spectrum analysis, by which a place where a peculiarity( discontinuity, discontinuity of differential coefficient) occurs can be specified.

Here, the Daubechies's analyzing wavelet is one of orthogonal wavelets, whereby the whole can be reconstituted by a partial space defined by the direct sum resolution. Now, if data vector is taken by an exponent of two as the Fourier transform, a partial space where a parallel movement and an enlargement/reduction is conducted as a unit of an exponent of two can be obtained. This corresponds to the multiple resolution analysis in which data vector is observed while changing the resolution. Furthermore, by taking an exponent of two, a high-speed transformation can be achieved as the Fourier transform. Besides, the analyzing wavelet generator 62 may produce the other kind of orthogonal wavelets.

Figure 5:
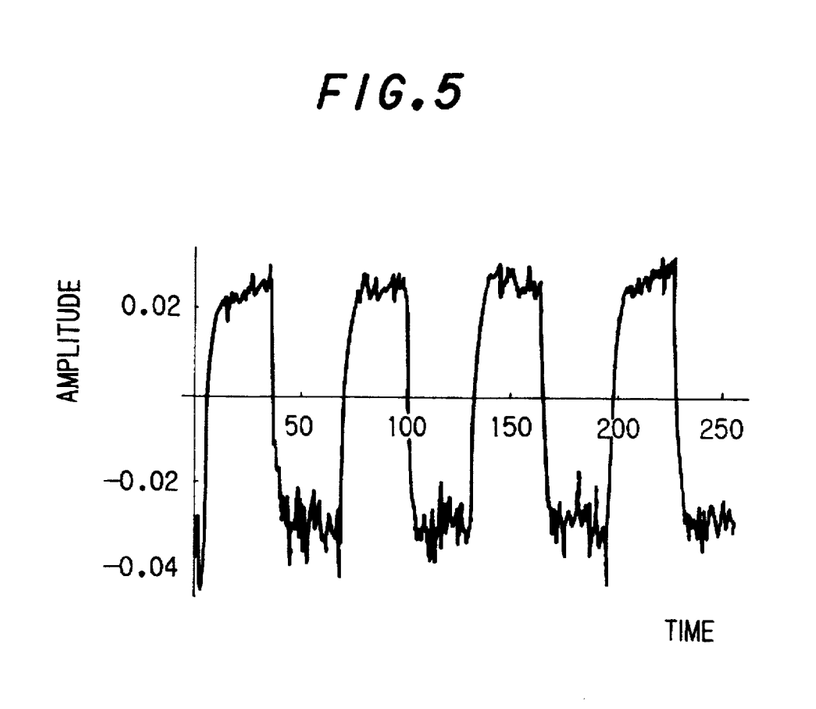
FIG. 5 shows a waveform which includes a harmonic wave.
Figure 6A:
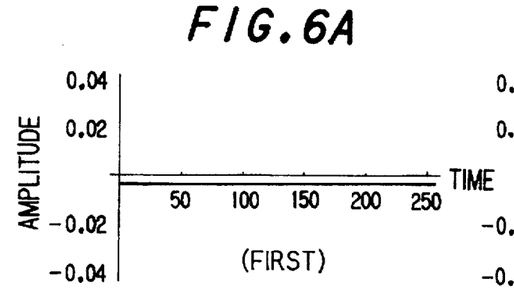
FIGS. 6A to 6H are resolved waveforms after the wavelet analysis.
Figure 6B:
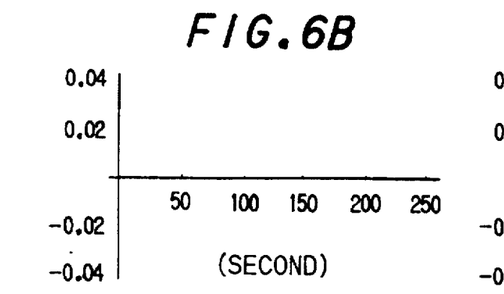
Figure 6C:
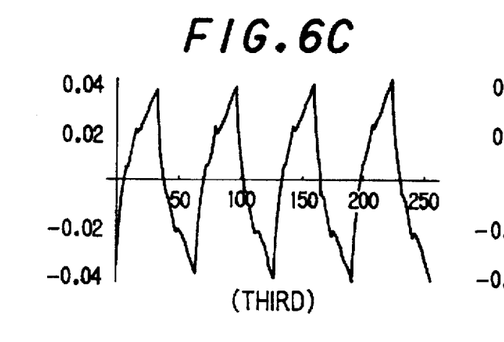
Figure 6D:
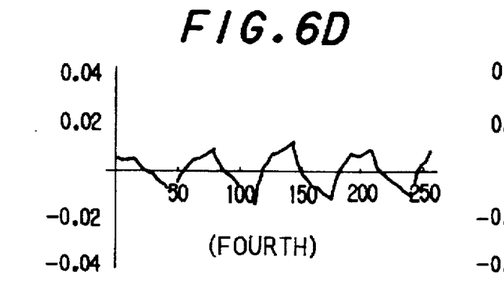
Figure 6E:
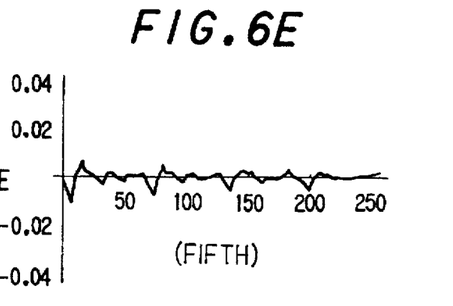
Figure 6F:
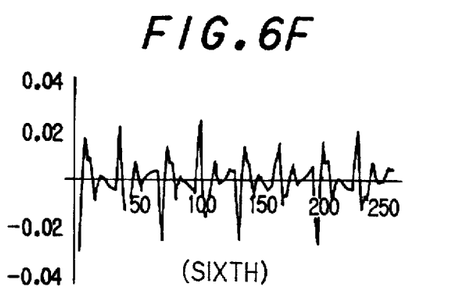
Figure 6G:
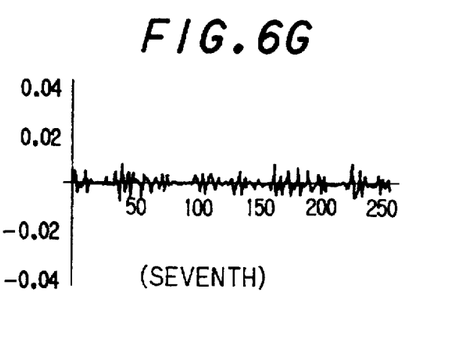
Figure 6H:
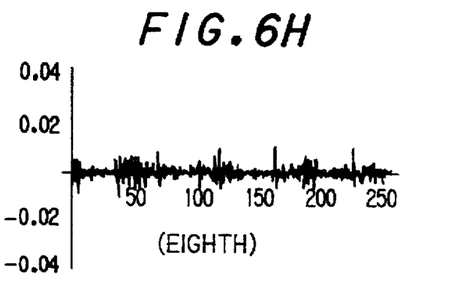

Now, to a waveform, as a measured data, which includes harmonic noise as shown in FIG. 5, the wavelet analysis is applied. The waveform in FIG. 5 is wavelet-transformed by the wavelet analyzer, being resolved into the respective spectra(wavelet spectra) corresponding to the order of wavelet. This order corresponds to the frequency in the Fourier transform.

After that, each of the wavelet spectra is processed by the inverse wavelet transform to reproduce a waveform of time domain after the wavelet analysis. FIGS. 6A to 6H show the respective waveform components resolved after the reproduction of waveforms of time domain. The operator analyzes the respective time waveform components and selects waveforms that appear to relate with the circuit operation, then, by adding them in the operational processor 61, a target waveform can be extracted by removing noise components.

Figure 7:
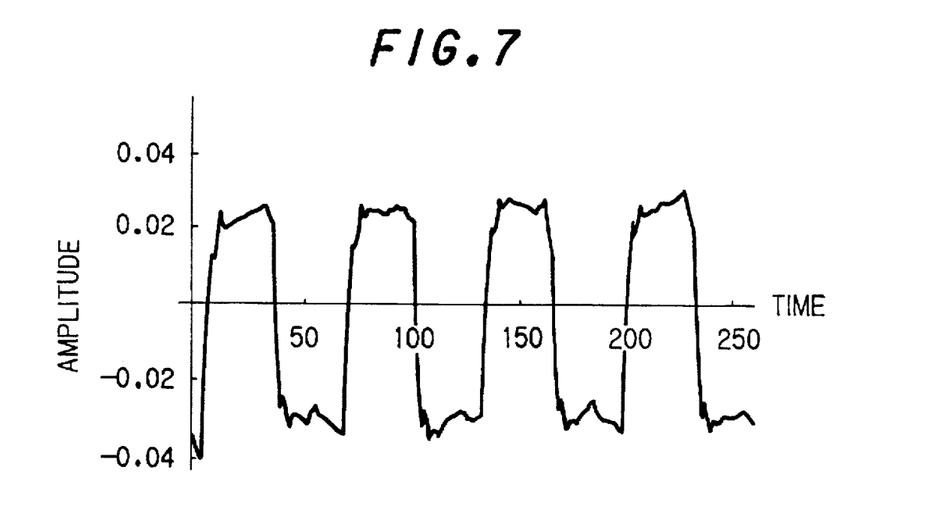
FIG. 7 shows a composite waveform in which the first to fifth resolved waveforms after the wavelet analysis to the waveform in FIG. 5 are added up.

FIG. 7 shows a composite waveform in which the resolved waveforms of the first order to the fifth order in FIGS. 6A to 6E are added up. It will be appreciated that the harmonic noise is removed and the essential waveform is reproduced. Thus, by adding up the resolved waveforms of the first order to a desired order, the filtering effect equal to that of a low-pass filter can be obtained. Similarly, by removing low-order components from the added components, the filtering effect equal to that of a high-pass filter can be obtained. Moreover, by adding up desired middle order components except the first order and the maximum order, the filtering effect equal to that of a band-pass filter can be obtained.

Meanwhile, in the conventional technique using the Fourier transform in which the selection in frequency domain is required, since it is difficult to relate with the circuit operation, it was difficult to judge until which order component is added up. In this embodiment, the operator can perform the filtering while observing a time waveform and keeping the information of the original measured waveform, whereby waveforms related with the circuit operation can be selected. Besides, the selection of filter characteristic and until which order component to be added up can be conducted by the inputting from the input device 10 through the input-output device 30 to CPU 60.

Next, a method of determining the correlation will be explained below. In the correlation analyzer 64 in CPU 60, the correlation analysis is conducted between the original measured waveform output from the storage device 50 and the respective order waveforms to be wavelet-analyzed which are output from the wavelet analyzer 63( Step 74). When the original measured waveform is represented by f(t), each order of waveform to be wavelet-transformed is represented by g(t) and their wavelet coefficient vectors are Tf(a) and Tg(a), respectively, the correlation coefficient of Tf(a) and Tg(a) is given by:

$$\gamma g(a) = \frac{|\overline{Tf(a)}|^T \overline{Tg(a)}}{|\overline{Tf(a)}| \, |\overline{Tg(a)}|} \quad (3)$$

where Tf(a), Tg(a) represent vectors obtained by removing their averages from the vectors Tf(a), Tg(a), respectively.

Figure 8:
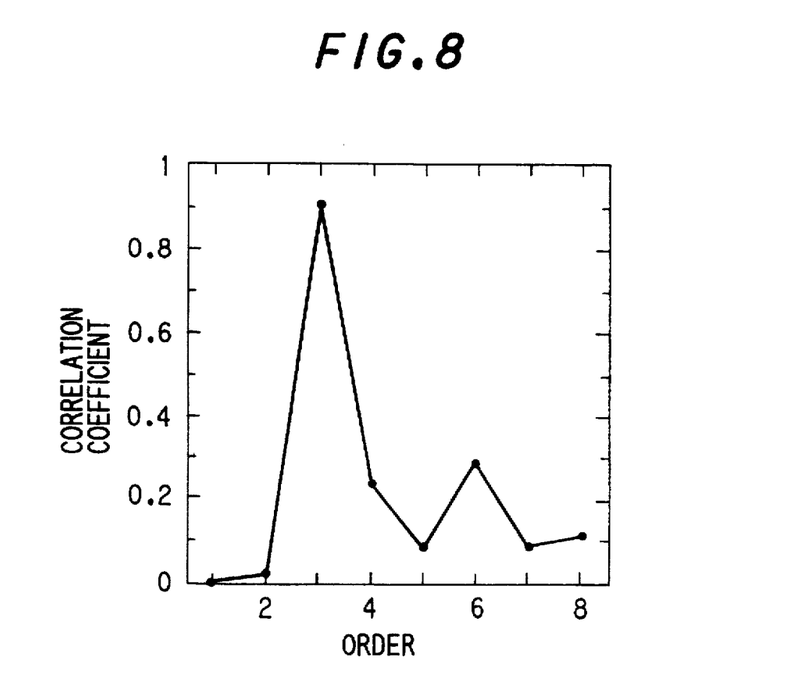
FIG. 8 shows the correlation between the original measured waveform and the respective order resolved waveforms.

FIG. 8 shows a result of the correlation analysis by the correlation analyzer 64 in CPU 60 in which the above method is used. In FIG. 8, it will be appreciated that the magnitude of the correlation coefficient is in the order of third, sixth, fourth, eighth, seventh, fifth, second and first resolved waveforms. Herein, it can be proved that, the bigger the correlation coefficient of wavelet solution waveform is, the more essential component of the original measured waveform it includes.

Figure 9:
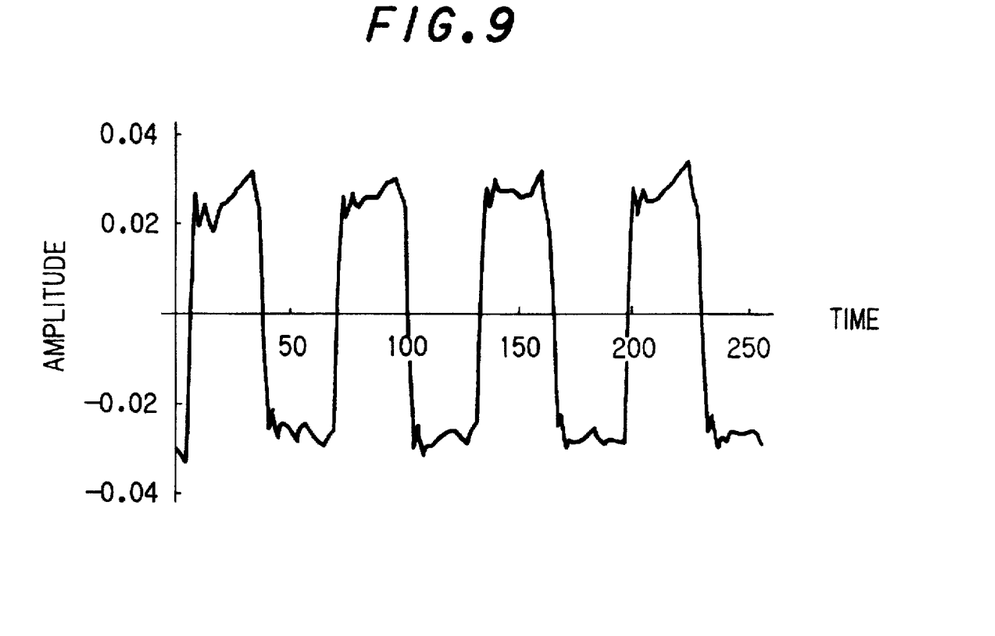
FIG. 9 shows a composite waveform in which the third, fourth and sixth resolved waveforms after the wavelet analysis are added up.

Accordingly, in the operational processor 61 in FIG. 3, the magnitude of correlation coefficient is identified( Step 75 in FIG. 4 ), then, based on the identified result, the rearrangement according to the magnitude of correlation coefficient is conducted( Step 76 in FIG. 4 ), selecting correlation coefficients bigger than a predetermined threshold value, adding up the resolved waveforms corresponding to the selected correlation coefficients. For example, if the correlation coefficients bigger than the threshold value belong to the third, sixth and fourth resolved waveforms, the composite waveform that these resolved waveforms are added up is as shown in FIG. 9, where the noise components related with lower correlation coefficients can be removed to provide an essential waveform.

Figure 10:
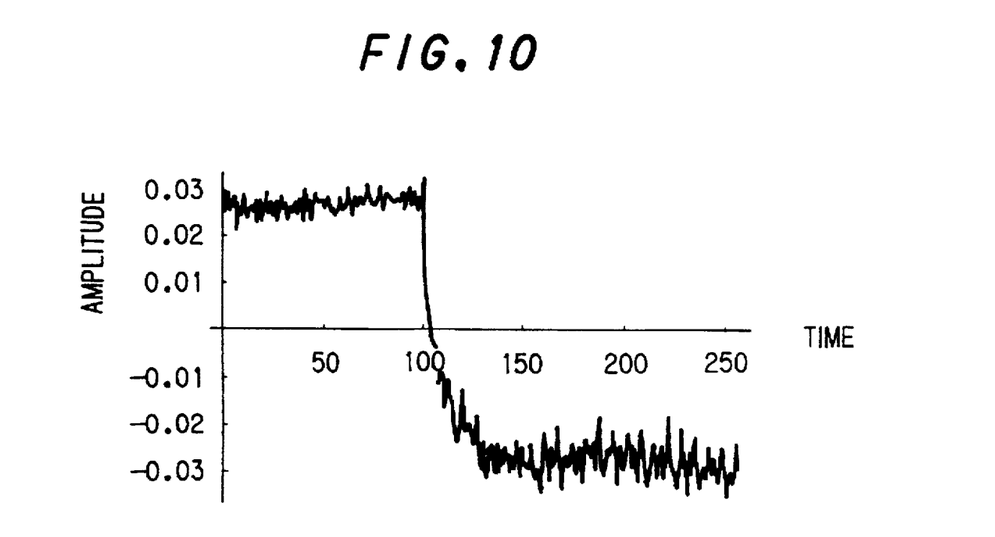
FIG. 10 shows a waveform partially cut out of the waveform in FIG. 5.
Figure 11:
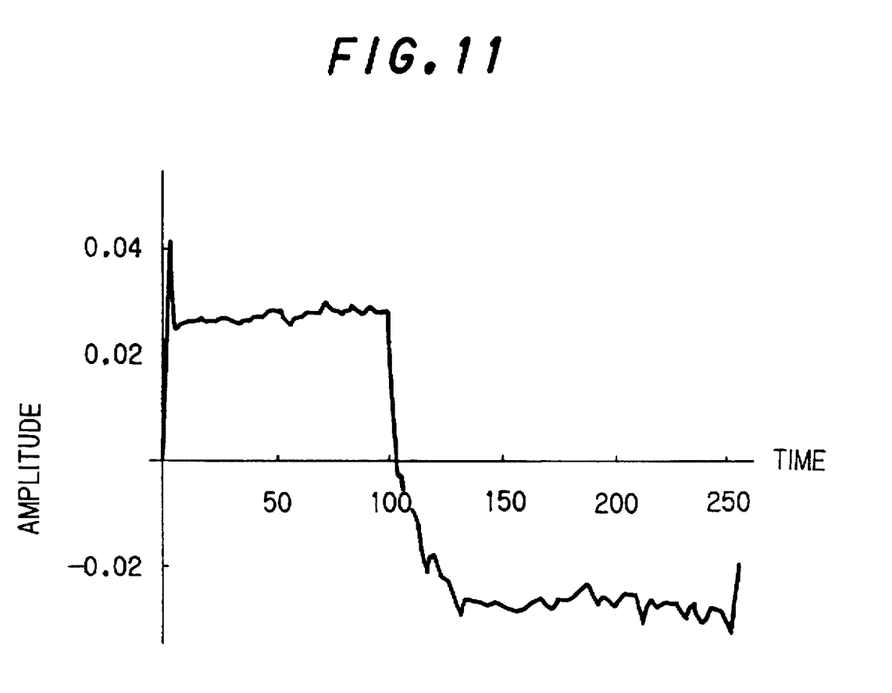
FIG. 11 shows a composite waveform in which the first to fifth resolved waveforms after the wavelet analysis to the waveform in FIG. 10 are added up.

On the other hand, if it is especially required that the variation of the falling part of the measured waveform in FIG. 5 is observed, by using a window function in time domain near the falling part, the operational processor 61 may cut out a limited time section of the measured waveform as shown in FIG. 10, thereafter performing the wavelet analysis and correlation analysis as described above. The composite waveform that the first to fifth resolved waveforms with bigger correlation coefficients after the correlation analysis between the original measured waveform and wavelet-analyzed waveforms are added up is as shown in FIG. 11, where the noise components related with lower correlation coefficients to the circuit operation can be removed.

Though the above explanation is regarding the time waveform, an electromagnetic intensity distribution( two-dimensional distribution) can be also processed by the filtering by similar wavelet analysis and correlation analysis.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A waveform analyzer, comprising:
    means for inputting measured data of an electronic device to be analyzed;
    means for generating an orthogonal analyzing wavelet;
    means for producing wavelet-analyzed components in which said measured data is wavelet-transformed into a plurality of wavelet spectra by using said orthogonal analyzing wavelet, thereafter said plurality of wavelet spectra are inverse-wavelet-transformed to produce said wavelet-analyzed components; and
    means for adding up a component with an order corresponding to a desired filter characteristic of said wavelet-analyzed components to get a filtered waveform.

2. A waveform analyzer, according to claim 1, wherein:
    said adding up means adds up a first order component to a desirable order component of said wavelet-analyzed components, if said desired filter characteristic is of a low-pass filter, said adding up means adds up a middle order component to the maximum order component of said wavelet-analyzed components, if said desired filter characteristic is of a high-pass filter, and said adding up means adds up an optional middle order component except said first order component and said maximum order component of said wavelet-analyzed components, if said desired filter characteristic is of a band-pass filter.

3. A waveform analyzer, comprising:
    means for inputting measured data of an electronic device to be analyzed;

means for generating an orthogonal analyzing wavelet;

means for producing wavelet-analyzed components in which said measured data is wavelet-transformed into a plurality of wavelet spectra by using said orthogonal analyzing wavelet, thereafter said plurality of wavelet spectra are inverse-wavelet-transformed to produce said wavelet-analyzed components;

means for analyzing a correlation between each of said wavelet analyzed components and said measured data input by said inputting means; and means for adding up a component with a correlation analysis result bigger than a threshold value of said wavelet-analyzed components to get a waveform in which a component with a correlation analysis result smaller than said threshold value is removed.

4. A waveform analyzer, comprising:

means for inputting measured data of an electronic device to be analyzed;

means for generating an orthogonal analyzing wavelet and a window function;

means for producing wavelet-analyzed components by wavelet-analyzing a limited time section of said measured data by using said orthogonal analyzing wavelet and said window function; and means for adding up a component with an order corresponding to a desired filter characteristic of said wavelet-analyzed components to get a filtered waveform.

5. A waveform analyzer, according to claim 4, wherein:

said adding up means adds up a first order component to a desirable order component of said wavelet-analyzed components, if said desired filter characteristic is of a low-pass filter, said adding up means adds up a middle order component to the maximum order component of said wavelet-analyzed components, if said desired filter characteristic is of a high-pass filter, and said adding up means adds up an optional middle order component except said first order component and said maximum order component of said wavelet-analyzed components, if said desired filter characteristic is of a band-pass filter.

6. A waveform analyzer, comprising:

means for inputting measured data of an electronic device to be analyzed;

means for generating an orthogonal analyzing wavelet and a window function;

means for producing wavelet-analyzed components by wavelet-analyzing a limited time section of said measured data by using said orthogonal analyzing wavelet and said window function;

means for analyzing a correlation between each of said wavelet analyzed components and said measured data input by said inputting means; and means for adding up a component with a correlation analysis result bigger than a threshold value of said wavelet-analyzed components to get a waveform in which a component with a correlation analysis result smaller than said threshold value is removed.

\* \* \* \* \*